United States Patent [19]
Jones

[11] 3,984,672
[45] Oct. 5, 1976

[54] SOLID STATE TRANSLATOR
[75] Inventor: Donald H. Jones, Pittsburgh, Pa.
[73] Assignee: Control Systems Research, Inc., Pittsburgh, Pa.
[22] Filed: Dec. 5, 1974
[21] Appl. No.: 529,701

[52] U.S. Cl. ............................ 235/186; 235/150.5; 340/347 SY
[51] Int. Cl.² ......................................... G06G 7/22
[58] Field of Search ................ 235/186, 189, 150.5, 235/150.52, 150.53; 340/347

[56] References Cited
UNITED STATES PATENTS

| | | | |
|---|---|---|---|
| 3,158,738 | 11/1964 | Pfeiffer | 235/186 X |
| 3,555,541 | 1/1971 | Egerton et al. | 235/186 X |
| 3,576,986 | 5/1971 | Brickner et al. | 235/150.5 X |
| 3,631,233 | 12/1971 | McKenna | 235/186 |
| 3,662,162 | 5/1972 | Kallio | 235/186 |

*Primary Examiner*—Jerry Smith
*Attorney, Agent, or Firm*—Robert D. Yeager; Howard G. Massung

[57] ABSTRACT

A transducer for combining an analog signal input and a digital signal input and providing an analog signal output, equal to the sum or difference, wherein the digital input signal is divided into a first component, for which a very accurate analog equivalent is provided and a second component for which a good approximate analog equivalent is provided. The translator is usually used in conjunction with a resolver which provides analog inputs in suppressed carrier trigonometric form. The translator performs certain trigonometric manipulations on the inputs from the resolver and the analog equivalents of the digital angle in order to obtain a signal proportional to the difference between the sensor resolver position and the digital angle command position. The first component of the digital angle, for which very precise analog equivalents are provided, uses a minimum number of high precision resistors. The outputs of the resolver are obtained, with appropriate sign changes when necessary, so that a few reference signals from high precision resistors can be used to determine the analog equivalent of the digital angle in one quadrant and by combining with the resolver outputs of the appropriate sign the value of the angle can be obtained for any quadrant. By proper selection of the signs for the trigonometric inputs from the resolver some of the analog equivalents of the digital inputs can even be obtained within the selected first quadrant. For example, if the analog equivalents of digital angles of 0°, 18°, and 36° are obtained, the analog value of any angle which is a multiple of 18° can be obtained with the selection of the proper sign. The second digital angle is fed to a voltage dividing network which is used to provide an analog approximation for the small digital angle. A programmable read only memory is provided for controlling switching and combining of the analog inputs, which are normally in sine and cosine form, and the analog equivalents of the digital inputs. By proper selection of the translator components and of the first large predetermined digital angle and the small digital angle, which is approximated in analog form, a translator output of any desired accuracy can be obtained.

33 Claims, 7 Drawing Figures

| DIGITAL INPUT | 111A | $\overline{112B}$ 112A | $\overline{113B}$ $\overline{114B}$ 113A 114A | 116 | 115C | 115B 115E 115G | 115F 115A 115D | ANGLE (degrees) |
|---|---|---|---|---|---|---|---|---|
| 0 | 1 | 0 | 1 | 0 | 1 | 0 | 0 | 0 |
| 50 | 1 | 0 | 1 | 0 | 0 | 1 | 0 | 18 |
| 100 | 1 | 0 | 1 | 0 | 0 | 0 | 1 | 36 |
| 150 | 1 | 0 | 0 | 1 | 0 | 0 | 1 | 54 |
| 200 | 1 | 0 | 0 | 1 | 0 | 1 | 0 | 72 |
| 250 | 0 | 0 | 0 | 0 | 1 | 0 | 0 | 90 |
| 300 | 0 | 0 | 0 | 0 | 0 | 1 | 0 | 108 |
| 350 | 0 | 0 | 0 | 0 | 0 | 0 | 1 | 126 |
| 400 | 0 | 0 | 1 | 1 | 0 | 0 | 1 | 144 |
| 450 | 0 | 0 | 1 | 1 | 0 | 1 | 0 | 162 |
| 500 | 0 | 1 | 1 | 0 | 1 | 0 | 0 | 180 |
| 550 | 0 | 1 | 1 | 0 | 0 | 1 | 0 | 198 |
| 600 | 0 | 1 | 1 | 0 | 0 | 0 | 1 | 216 |
| 650 | 0 | 1 | 0 | 1 | 0 | 0 | 1 | 234 |
| 700 | 0 | 1 | 0 | 1 | 0 | 1 | 0 | 252 |
| 750 | 1 | 1 | 0 | 0 | 1 | 0 | 0 | 270 |
| 800 | 1 | 1 | 0 | 0 | 0 | 1 | 0 | 288 |
| 850 | 1 | 1 | 0 | 0 | 0 | 0 | 1 | 306 |
| 900 | 1 | 1 | 1 | 1 | 0 | 0 | 1 | 324 |
| 950 | 1 | 1 | 1 | 1 | 0 | 1 | 0 | 342 |

SOLID STATE TRANSLATOR

BACKGROUND OF THE INVENTION

Field of the Invention

This invention relates to translators which combine a digital input and an analog input; and, more particularly, to translators which breaks the digital signal into components for which analog equivalents are determined and then combines them with the analog input.

Description of the Prior Art

Translators which provide an analog output from digital and analog inputs are known in the prior art. Prior art translators are known which utilize amplitude modulated sine wave signals from a resolver, which corresponds to an angular position of the resolver, and digital words in coded form, corresponding to the desired position of the resolver shaft, and provide an output signal equivalent to the difference. In general, translators perform the computation of the function sin $(\theta - \phi)$ sin $\omega t$ where theta $(\theta)$ is the angle of the resolver and phi $(\phi)$ is the desired digital input. Sin $\omega t$ is a carrier whose envelopes define the trigonometric function under consideration. Throughout the following "sin $\omega t$" will normally be ommitted since it provides no useful information and is only a carrier. That is, it is common in the prior art to explain the operations in trigonometric form without including the carrier. Prior art translators normally comput the function of sin $(\theta - \phi)$ based on the following trigonometric identity: sin $(\theta - \phi) = \sin \theta \cos \phi - \cos \theta \sin \phi$. The functions, sin $\theta$ cos $\phi$, and, $- \cos \theta \sin \phi$, are generated by operating two sets of analog switches on the resolver output and weighing the sin $\theta$ and cos $\theta$ terms by precision weighing networks corresponding to the weight of sin $\phi$ and cos $\phi$. The quantities are then algebraically added to give the desired function. This method requires a large number of precision components which are expensive. Trigonometric functions are also sometimes solved by using a plurality of transformers having a plurality of taps to provide the desired trigonometric signals. This requires several specially built transformers and is relatively expensive.

Prior art U.S. Pat. No. 3,543,011 utilizes a trigonometric function to add or subtract two analog angles expressed in sine and cosine form. The apparatus disclosed in U.S. Pat. No. 3,543,011 uses a plurality of transformers having numerous taps to effect multiplication by a factor proportional to the tangent of one-half the angle to be added, in accordance with the mathematical properties of the sines and cosines of the sums or differences of the two angles.

Prior art U.S. Pat. Nos. 2,839,711; 2,849,668; and 2,967,017 teach digital to analog converters, for converting an input digital signal to an output analog signal in sine and cosine form. These prior art patents utilize a plurality of transformers having numerous taps which are interconnected in response to the input digital signal to provide the proper analog output. Rotary stepping switches are used for changing the connections of the plurality of transformers in response to the digital input. Prior art U.S. Pat. Nos. 2,849,668 and 2,967,017 recognize the use of the following trigonometric functions: sin $(a + b)/\cos b = \tan b \cos a + \sin a$; and, cos $(a + b)/\cos b = \cos a - \tan b \sin a$; when the corresponding vector angle $b$ is small.

Prior art U.S. Pat. Nos. 2,839,711; 2,849,668; 2,967,017; and 3,543,011 have the disadvantage of requiring a plurality of specially built and expensive ratio transformers which have numerous taps. The apparatus disclosed in these prior art patents also utilize rotary stepping switches which are relatively slow acting and thus introduce unwanted time delays. Some prior art systems have utilized trigonometric equations involving the tangent for relatively small vector angles. These equations have never been applied to large angles, and in fact they are not directly solvable for some tangent angles. In particular the equations are indeterminate for tangent angles of 90° and 270°.

SUMMARY OF THE INVENTION

A solid state translator is provided for determining the difference between an analog input and a digital input which utilizes a small number of precision components.

A small number of highly accurate analog equivalents for digital angles are provided. These highly accurate analog equivalents lie within a preselected angular range, such as 0° to 45°. The digital angle input, which could be for example 108°, is changed to an angle within the 0° to 45° range such as 18° (108° − 90°). The analog angle input, which for example could be 215° is manipulated, as a function of the change in the digital angle, so that it is expressed as an angle of 125° (215° −90°). Thus the difference 107°, between the digital angle input changed to be within the preselected range and the manipulated analog input, is equal to 125° − 18°; and, this is the same as the difference 107°, between the digital angle input 108° and the analog angle input 215°. Expressing the digital angle within a preselected range and manipulating the analog input so that the desired difference is obtained, requires that the analog equivalent of the digital angle input only be obtained for a relatively small number of angles. This greatly reduces the number of high accuracy components required.

In one embodiment, the translator divides the digital angle input into a major angle componet, for which a highly accurate analog equivalent signal is provided, and a digital minor angle component, which represents a small angle and for which an analog angle equivalent of lesser precision is provided. The analog equivalents of the major angle component and the minor angle component are combined with the analog angle input and an output representing the difference is provided. The high precision analog equivalents of the major digital angle component are obtained by utilizing a minimum number of precision components to obtain the desired angular representations in the first quadrant and then changing the sign, where appropriate, and combining with the analog inputs, which are usually in sine and cosine form, to reflect these values in the proper quadrants.

The disclosed translator performs the desired operation by using the following formula:

$$\text{Sin } (\theta - \phi) = (\sin \theta - \cos \theta \tan \phi) \cdot (\cos \phi)$$

In this formula sin $\theta$ and cos $\theta$ represent the amplitudes of the resolver outputs, and tan $\phi$ and cos $\phi$ are the programed weights corresponding to the desired digital angle $\phi$. Weights of tan $\phi$ and cos $\phi$ are required accurately only for large angles. For small angles cos $\phi$ is approximately equal to 1 and the correction factor cos $\phi$ can be omitted and only slightly affects the magnitude of sin $(\theta - \phi)$. The disclosed translator divides $\phi$ into a major angle component, $\phi 1$, and a difference, $\delta$. Thus $\phi = \phi 1 + \delta$. A small predetermined number of digital angles, corresponding to varous positions, are provided with highly accurate analog equivalents. By manipulating the analog inputs the small number of highly accurate analog equivalents essentially divide each quadrant into a selected number of angles so that $\phi$ is fairly close to $\phi 1$ and $\delta$ is small. This permits an inexpensive, but accurate, approximation of $\delta$ to be obtained. The weights corresponding to tan $\phi 1$ and cos $\phi 1$ are needed only for a predetermined small number of unique angles. These weights can be obtained with a few high precision components. These components are only needed for this few number of angles, since the weights for angles in the other three quadrants can always be expressed in terms of the weights for the three preselected angles, with proper manipulation of the analog input. Thus for predetermined angles, the four quadrants can be effectively divided into multiple parts. Thus exact analog equivalents are provided for the desired points. The digital minor angle component than represents the difference between the nearest predetermined major angle component and the digital input angle. This difference which is a small angle can then be converted to an analog equivalent by a weighing network which does not require components of as high precision. A programmable read only memory (PROM) can be utilized for control of proper switching, sign changing and manipulation of the analog inputs to provide the proper value for the predetermined major angle digital input. By using the teaching of this invention, the number of high precision components required is greatly reduced.

The complex logic involved in operating the analog switches, which control sign changing and manipulations of the analog inputs, is carried out in a programmable read only memory (PROM) chip and a four bit full adder (F.A.) circuit or other logic devices. the entire trigonometric computation can be accomplished using operational amplifiers, precision resistors, analog switches, a PROM and a full adder circuit. The output of the translator is a modulated signal proportional to sin $(\theta - \phi)$.

It is an object of this invention to provide a resolver translator which utilizes a small number of precision components to provide many analog equivalents of predetermined digital inputs.

It is an object of this invention to provide a translator which utilizes a high precision digital to analog converter for a first portion of the digital input and a medium accuracy digital to analog converter for a second portion of the digital input signal.

It is an object of this invention to provide an electronic circuit for accepting a plurality of angle inputs and providing an output proportional to the algebraic summation of the angular inputs.

It is an object of this invention to show a new and novel technique for the utilization of the equations sin $(\theta - \phi) = (\sin \theta - \cos \theta \tan \theta) \cos \phi$ and $\cos (\theta - \phi) = (\cos \theta + \sin \theta \tan \phi) \cos \phi$ for all angles; thus providing for the precise generation of trionometric multiplication and manipulation for any angle from 0° to 360°. These equations can be employed to generate an angular output proportional to the sine and cosine of the algebraic summation of the two angle inputs. The novel approach incorporated in this invention provides for unique trigonometric manipulation, requiring the accurate generation of angle ratios only from 0° to 45° maximum. The technique results in a few number of components and provides highly accurate outputs limited only by the degree of precision that the tan $\phi$ is generated by over the range from 0° to 45°.

It is still a further object of this invention to provide means for correction of the inherent gain error (cos $\phi$) indicated as the multiplying coefficient in the equations: sin $(\theta - \phi) = (\sin \theta - \cos \theta \tan \phi) (\cos \phi)$ and cos $(\theta - \phi) = (\cos \theta + \sin \theta \tan \phi) (\cos \phi)$.

A still further object of this invention is to provide means for accurately generating the sine and cosine respectively of a single digital angular input. The generation of these quantities is performed with a hybrid digital-analog technique and provides the outputs in suppressed carrier form which can be applied directly to position transducers involving quadrature winding such as resolvers, synchros and other sine-cosine devices.

A yet further object of this invention provides for the use of a digital logic system that will accept digital angular information in the form of conventional digital codes such as binary, BCD, decimal, etc., and provide outputs to the switching elements of the translator section in accordance with predetermined program.

A further object of the invention is the use of the above techniques incorporated in a plurality with appropriate combining means for providing a trigonometric output related to two or more angular inputs.

BRIEF DESCRIPTION OF THE DRAWINGS

For a better understanding of the invention, reference may be had to the preferred embodiments exemplary of the invention shown in the accompanying drawings, in which.

DESCRIPTION OF THE PREFERRED EMBODIMENT

This invention provides a device for determining the algebraic summation of a first input angle ($\theta$), which is in analog form and a second input angle ($\phi$), which is in digital form. Prior art devices for providing this summation have been constructed, however, due to the complexity of providing a summation of an analog angle and a digital angle, a large number of components have been employed requiring high precision resulting in substantial cost.

Figure 5:
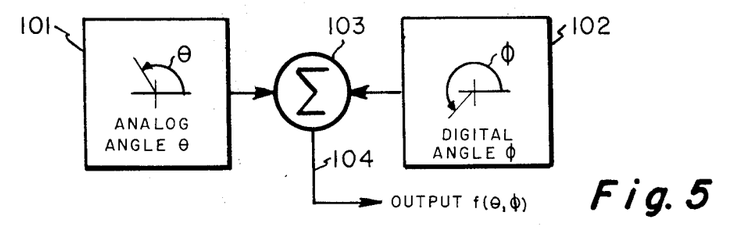
FIG. 5 is a block diagram of an angle translator.

The technique employed in the disclosed invention incorporates the use of a number of trigonometric identities combined in such a manner that the resulting device can be constructed with a minimum number of components and requiring only a few high accuracy elements. The invention is best understood by making reference to FIGS. 5 through 7, which show a block diagrams of the functions performed by this invention. Referring to FIG. 5, block 101 represents the angle $\theta$ in analog form, which is algebraically summed by the combining means 103 with the digital angle, $\phi$, represented by block 102. The combined output on line 104 of the combining means 103 is a signal proportional to the summation, or a trigonometric function of the summation, of angle $\theta$ and angle $\phi$.

Figure 6:
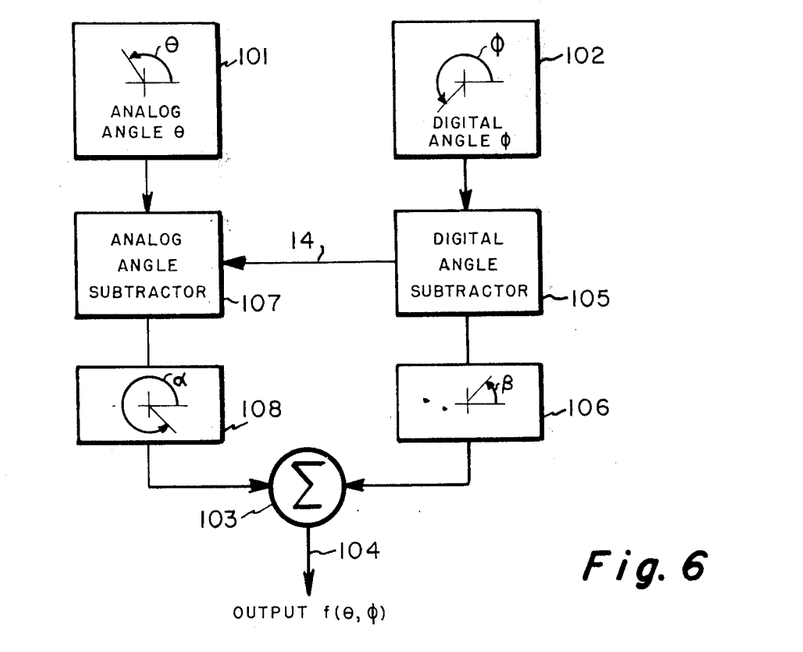
FIG. 6 is a block diagram of an angle translator modified in accordance with the teaching of the present invention.

Due to the complexity of providing this function for all values of $\theta$ and $\phi$ from 0° to 360°, devices of this type have incorporated a large number of components as shown by the prior art systems. The block diagram shown in FIG. 6 represents the basic, but new and novel, technique employed to accomplish the function of FIG. 5. Referring to FIG. 6, the analog angle ($\theta$) is in block 101 and the digital angle ($\phi$) is in block 102. Element 105 represents a digital subtractor which reduces the value of the digital angle $\phi$ to an equivalent angle $\beta$ which is represented by block 106. Furthermore, element 107 represents an analog angle subtractor which educes the analog angle $\theta$ by the same amount that was utilized for reducing the digital angle $\phi$ and results in an equivalent analog angle $\alpha$ shown in 108. The combining means 103 accepts the equivalent angle $\alpha$ and the equivalent angle $\beta$ and performs an algebraic summation. The output of the combining means 103 is an output signal proportional to a trigonometric function of the difference between angle $\alpha$ and angle $\beta$ however, since an equal angle has been subtracted from both the analog angle input $\theta$ and the digital angle input $\phi$, the output of the combining means is equal to the difference between angle $\theta$ and angle $\phi$.

A mathematical representation of the manipulations performed by the elements 101 through 108 of FIG. 6 proves the fact that the output of the combining means 103 in FIG. 6 is exactly equal to the output of the combining means 103 of FIG. 5. The mathematical proof is as follows:

The desired quantity to be realized is the difference, or a trigonometric function of the difference, between the analog angle $\theta$ and the ditigal angle $\phi$. Represented mathematically:

$$\text{Difference Angle} = \psi = \theta - \phi. \tag{1}$$

The mathematical expressions for the block diagram of FIG. 6 are as follows:

$$\beta = \phi - \chi \tag{2}$$

and $$\alpha = \theta - \chi \tag{3}$$

which illustrates the functions performed by elements 105 and 107, respectively. Furthermore, the combining means 103 forms the relationship of:

$$A = \alpha - \beta \tag{4}$$

whereby if equations (2) and (3) are substituted into equation (4), the result is:

$$A = (\theta - \chi) - (\phi - \chi) \tag{5}$$

and by simple reduction, the result can be expressed as:

$$A = \theta - \phi \tag{6}$$

which is precisely equal to the quantity $\psi$ indicated in equation (1). Hence, the technique of subtracting an equal quantity from both the digital angle $\phi$ and the analog angle $\theta$ and then performing an algebraic difference operation results in the same value as if the two angles were subtracted directly.

In a preferred embodiment of this invention, the analog angle $\theta$ is represented by the analog signals representative of sin $\theta$ and the cos $\theta$. The digital angle $\phi$ is represented by a ditigal work in any coded form such as BCD, binary, decimal, etc. The mathematical treatment presented as follows relates to the teachnique utilized in subtracting an equal quantity from both the analog angle $\theta$ and the digital angle $\phi$.

The analog input angle $\theta$ can be represented by signals which are proportional to the sin $\theta$ and cos $\theta$. These two signals can be direct voltages which are proportional to sin $\theta$ and cos $\theta$, respectively, or be suppressed carrier signals wherein the sin $\theta$ and cos $\theta$ input terms would also be multiplied by sin $\omega t$ factor which would indicate the signals are in modulated form. It is quite common to utilize the suppressed carrier form since signals derived frm position and velocity transducers many times utilize the suppressed carrier type of signal.

In the description following, sin $\omega t$ will be omitted since it does not affect the mathematical treatment. The carrier signal only represents a media for transmitting the sine and cosine input signals.

The disclosed angle translator accepts the sin $\theta$ and cos $\theta$ analog inputs along with a digital input representative of the angle $\phi$. The translator utilizing the techniques of angle subtraction provides an output which is proportional to sin $(\theta - \phi)$. Other direct outputs or trigonometric outputs such as cos $(\theta - \phi)$ can also be formed utilizing the disclosed techniques.

The mathematical description of the functions utilized within the angle translator with subtractive techniques follows.

If we examine two of the possible outputs from the translator, namely cos $(\theta \phi)$ and sin $(\theta - \phi)$, we can expand these trigonometric quantities as follows:

$$\sin (\theta - \phi) = \sin \theta \cos \phi - \cos \theta \sin \phi \tag{7}$$

$$\cos (\theta - \phi) = \cos \theta \cos \phi + \sin \theta \sin \phi \tag{8}$$

Dividing each of equations (7) and (8) by cos $\phi$ and substituting $$\tan \phi = \sin \phi / \cos \phi \tag{9}$$

results in $$\sin (\theta - \phi) = \cos \phi [\sin \theta - \cos \theta \tan \phi] \tag{10}$$

$$\cos (\theta - \phi) = \cos \phi [\cos \theta + \sin \theta \tan \phi] \tag{11}$$

Equations (10) and (11) have been employed in prior art devices for values of $\phi$ representing relatively small angles. The problem with the use of Equations (10) and (11) for all values of $\phi$ from 0° to 360° is obvious when the value of $\phi$ is equal to 90° or 270°, in which case the value of tan $\phi$ becomes infinite and cos $\phi$ is equal to zero resulting in an indeterminate value for equations (10) and (11).

This invention will show a new and novel use for using equations (10) and (11) for all angles of $\phi$ through the use of angle reduction of both the angles $\theta$ and $\phi$. Furthermore, the invention will require the determination of tangent values only of angles of less than 45°.

In continuing with mathematical analysis, let us examine the basic geometry of the angle $\phi$, over the full range of 0° to 360°. By use of the cardinal points of the polar system of 0°, 90°, 180° and 270°, the value of $\phi$ can be represented by the algebraic summation of an equivalent angle $\beta$ which is less than or equal to 45° and a cardinal angle, being either 0°, 90°, 180° or 270°. In a mathematical relationship, we can now define angle $\phi$ by the following equation:

$$\phi = [n90 \pm \beta] \tag{12}$$

where $n = 0, 1, 2, 3$ and
$\beta \leq 45°$

Equation (12) can be rearranged in the form of:

$$\beta = |[\phi - n90]| \tag{13}$$

where the term ($n90$) represents a subtractive measure from the original digital angle $\phi$. Thus, any angle $\phi$ can be represented by an equivalent angle of measure less than or equal to 45° summed algebraically with an angular measure of $n90$. For example, for a value of $\phi$ equal to 120°, the measure of $\beta$ would be 30° with $n$ equal to 1. For a value of $\phi$ equal to 160°, the measure of $\beta$ would be 20° with $n = 2$.

By use of the above mathematical reduction scheme combined with equations (7) and (8), we can develop a general equation for the sine and cosine of the angle summation of ($\theta - \phi$).

Rewriting equations (7) and (8) and making the substitution of the digital reduction equation for angle $\phi$ from equation 12 we obtain:

$$\sin(\theta - \phi) = \sin[\theta - (n90 \pm \beta)] \tag{14}$$

and $$\cos(\theta - \phi) = \cos[\theta - (n90 \pm \beta)] \tag{15}$$

Regrouping equations (14) and (15)

$$\sin(\theta - \phi) = \sin[(\theta \pm \beta) - n90] \tag{16}$$

and $$\cos(\theta - \phi) = \cos[(\theta \pm \beta) - n90] \tag{17}$$

By use of the multiple angle identity for sine and cosine, i.e.

$$\sin(A-B) = \sin A \cos B - \cos A \sin B \tag{18}$$

$$\cos(A-B) = \cos A \cos B + \sin A \sin B \tag{19}$$

Equations (16) and (17) can be trigonometrically expanded to:

$$\sin(\theta - \phi) = \sin(\theta \pm \beta) \cos n90 - \cos(\theta \pm \beta) \sin n90 \tag{20}$$

$$\cos(\theta - \phi) = \cos(\theta \pm \beta) \cos n90 + \sin(\theta \pm \beta) \sin n90 \tag{21}$$

Evaluating the trigonometric functions of $n90$ for $n = 0, 1, 2, 3$ results in the following equations with matrix coefficients for all valid values of $n$.

$$\sin(\theta - \phi) = \sin(\theta \pm \beta) \begin{bmatrix} 1 \\ 0 \\ -1 \\ 0 \end{bmatrix} - \cos(\theta \pm \beta) \begin{bmatrix} 0 \\ 1 \\ 0 \\ -1 \end{bmatrix} ; \begin{bmatrix} 0 \\ 1 \\ 2 \\ 3 \end{bmatrix}_{n=} \tag{22}$$

$$\cos(\theta - \phi) = \cos(\theta \pm \beta) \begin{bmatrix} 1 \\ 0 \\ -1 \\ 0 \end{bmatrix} + \sin(\theta \pm \beta) \begin{bmatrix} 0 \\ 1 \\ 0 \\ -1 \end{bmatrix} ; \begin{bmatrix} 0 \\ 1 \\ 2 \\ 3 \end{bmatrix}_{n=} \tag{23}$$

Note that in equations (22) and (23), the values of the matrix coefficients are either 0, 1 or −1 for the values of $n = 0, 1, 2$ and 3.

Furthermore, for any given value of $n$, there will be one and only one non-zero coefficient for each equation. Therefore, the value of $\sin(\theta - \phi)$ and $\cos(\theta - \phi)$ can be defined by a single term representing either the $\sin(\theta \pm \beta)$ or $\cos(\theta \pm \beta)$ for all valid values of $n$.

For example:
for $n = 0$, $\sin(\theta - \phi) = \sin(\theta \pm \beta)$ and $\cos(\theta - \phi) = \cos(\theta \pm \beta)$;
for $n = 1$, $\sin(\theta - \phi) = -\cos(\theta \pm \beta)$ and $\cos(\theta - \phi) = \sin(\theta \pm \beta)$;
for $n = 2$, $\sin(\theta - \phi) = -\sin(\theta \pm \beta)$ and $\cos(\theta - \phi) = -\cos(\theta \pm \beta)$; and
for $n = 3$, $\sin(\theta - \phi) = +\cos(\theta \pm \beta)$ and $\cos(\theta - \phi) = -\sin(\theta \pm \phi)$.

By virtue of the fact that the coefficients of the terms and equations (22) and (23) have alternating zero values, a great simplification in hardware can be achieved.

The previous treatment has shown a reduction of the digital angle $\phi$ from any measure throughout the full values of 0° to 360° to an equivalent angle $\beta$ between 0° to 45° and a cardinal point summation of $n90$ where $n$ is either 0, 1, 2 or 3.

Since the equivalent angle $\beta$ has been defined to have a measure of less than or equal to 45°, the form of the equations (10) and (11) can be now employed to further simplify equations (22) and (23).

Substituting the following:

$$\sin(\theta \pm \beta) = \cos \beta [\sin \theta \pm \cos \theta \tan \beta] \tag{24}$$

$$\cos(\theta \pm \beta) = \cos \beta [\cos \theta \mp \sin \theta \tan \beta] \tag{25}$$

Into equations (22) and (23) yields:

$$= \cos\beta \left\{ \begin{bmatrix} 1 \\ 0 \\ -1 \\ 0 \end{bmatrix} \begin{matrix} \sin(\theta - \phi) = \\ (\sin\theta \pm \cos\theta\tan\beta) - \end{matrix} \begin{bmatrix} 0 \\ 1 \\ 0 \\ -1 \end{bmatrix} (\cos\theta \mp \sin\theta\tan\beta) \right\} ; \begin{bmatrix} 0 \\ 1 \\ 2 \\ 3 \\ n= \end{bmatrix} \quad 26.$$

$$\cos\beta \left\{ \begin{bmatrix} 1 \\ 0 \\ -1 \\ 0 \end{bmatrix} \begin{matrix} \cos(\theta - \phi) = \\ (\cos\theta \mp \sin\theta\tan\beta) + \end{matrix} \begin{bmatrix} 0 \\ 1 \\ 0 \\ -1 \end{bmatrix} (\sin\theta \pm \cos\theta\tan\beta) \right\} ; \begin{bmatrix} 0 \\ 1 \\ 2 \\ 3 \\ n= \end{bmatrix} \quad 27.$$

For:
$n = 0, 1, 2, 3$ and
$0° \leq \phi \leq 360°$
$0° \leq \theta \leq 360°$ and
$\beta = |\theta - n90|$ and always $\leq 45°$ By virtue of the alternating zero coefficients of equations (26) and (27), only one term of the equations are required for any value of $n$ equal to 0, 1, 2, 3.

Examples of the use of equations (26) and (27) are indicated as follows for the $\sin(\theta - \phi)$.

TABLE I

| Angle $\phi$ | N | Function Equation | Equivalent Angle |
|---|---|---|---|
| 315° to 45° | 0 | $\sin(\theta-\phi) = (+1)(\sin\theta \pm \cos\theta\tan\beta)\cos\beta$ | $\beta = \|\phi\|$ |
| 45° | 0 | $\cos(\theta-\phi) = (+1)(\cos\theta \mp \cos\theta\tan\beta)\cos\beta$ | $\beta = \|\phi\|$ |
| 45° to 135° | 1 | $\sin(\theta-\phi) = (-1)(\cos\theta \mp \sin\theta\tan\beta)\cos\beta$ | $\beta = \|\phi-90\|$ |
| 135° | 1 | $\cos(\theta-\phi) = (+1)(\sin\theta \pm \cos\theta\tan\beta)\cos\beta$ | $\beta = \|\phi-90\|$ |
| 135° to 225° | 2 | $\sin(\theta-\phi) = (-1)(\sin\theta \pm \cos\theta\tan\beta)\cos\beta$ | $\beta = \|\phi-180\|$ |
| 225° | 2 | $\cos(\theta-\phi) = (-1)(\cos\theta \mp \sin\theta\tan\beta)\cos\beta$ | $\beta = \|\phi-180\|$ |
| 225° to 315° | 3 | $\sin(\theta-\phi) = (+1)(\cos\theta \mp \sin\theta\tan\beta)\cos\beta$ | $\beta = \|\phi-270\|$ |
| 315° | 3 | $\cos(\theta-\phi) = (-1)(\sin\theta \pm \cos\theta\tan\beta)\cos\beta$ | $\beta = \|\phi-270\|$ |

Figure 7:
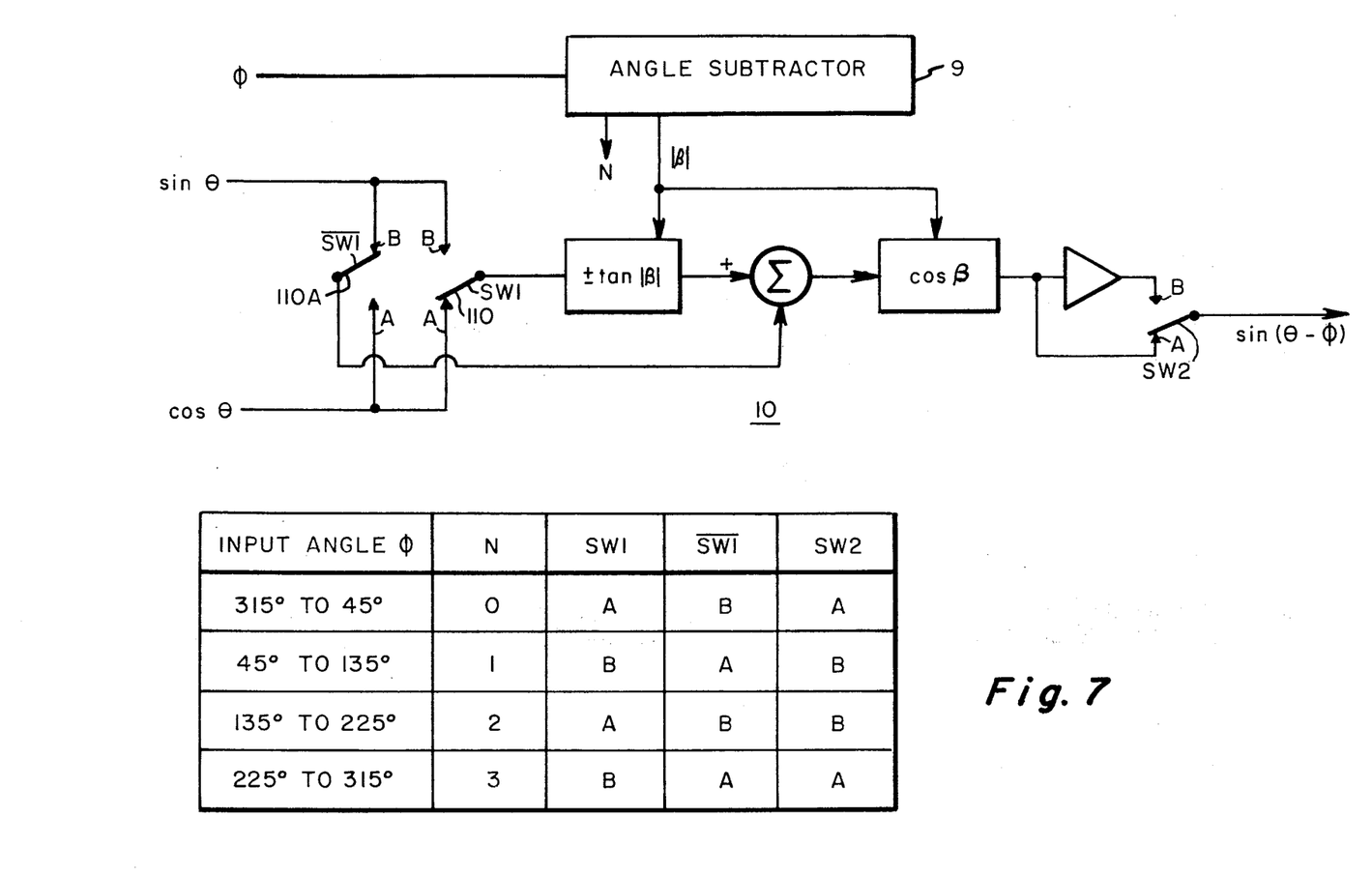
FIG. 7 is a translator in accordance with the present invention for sine and cosine analog inputs.

Refer now to FIG. 7, there is shown a block diagram for a translator 10, which provides $\sin(\theta - \phi)$ in accordance with equations 26 and 27. Only two switches SW1 and $\overline{SW1}$ are required to perform the calculation using the method illustrated above. Furthermore, the angle subtractor 9, can be constructed with a programmable memory. Programmable memories are relatively inexpensive and can accommodate virtually any type of digital input code. FIG. 7, which is set for an angle from 315° to 45°, shows that the $\sin\theta$ and $\cos\theta$ inputs are combined with the output of digital subtractor 9. This is multiplied by $\cos\beta$, providing an output of $(\sin\theta \pm \tan\beta \cos\theta)\cos\beta$ which is in accordance with equation 26.

Figure 1:
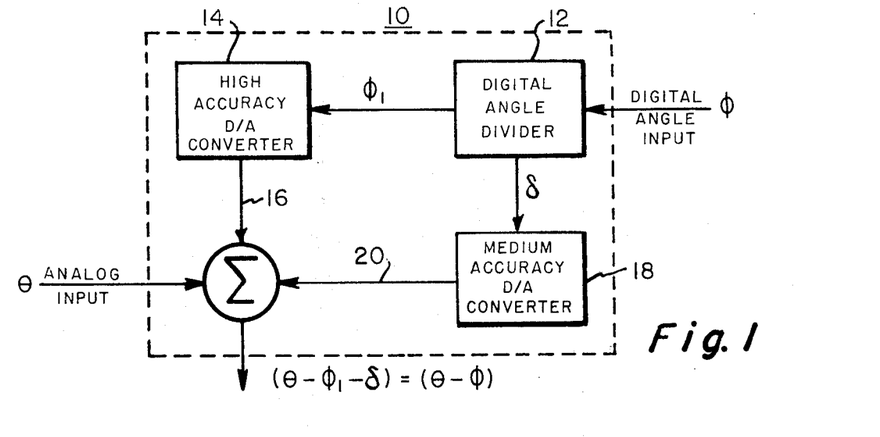
FIG. 1 is a block diagram of a translator utilizing the teaching of the present invention.

Referring now to FIG. 1 there is shown another embodiment of a translator utilizing the teaching of the present invention. FIG. 1 shows a solid state translator which provides an analog output representing the difference between an analog input theta ($\theta$) and a digital position input phi ($\phi$). The digital angle input ($\phi$) is fed into digital angle divider 12 of translator 10. The digital angle divider 12 breaks the digital input angle ($\phi$) into two components $\phi1$ and $\delta$. $\phi1$ can be any one of a select number of angles, for which a very high accuracy digital to analog conversion can be obtained. The digital angle $\delta$ represents the difference between the major digital angle component $\phi1$ and the digital input angle ($\phi$). Various values for $\phi1$ are provided for possible digital angle positions, represented over a 360° cycle, so that any digital input is only separated from a selected major digital angle $\phi1$ by a relatively small angle $\delta$ (delta). Several values of $\phi1$ are provided in each quadrant. $\delta$ then represents the difference between the digital input and the selected value of $\phi1$, in positive, negative or absolute terms. The selected angle $\phi1$ is fed to a high accuracy digital to analog converter 14 which provides a highly accurate analog representation of the major digital angle component $\phi1$ along line 16. The minor digital angle component $\delta$ is fed to a medium accuracy digital to analog converter 18. The output of the medium accuracy digital to analog converter 18 provided on line 20 is a good analog approximation of the digital angle $\delta$. The analog equivalents of the digital angle $\phi1$ and the digital angle $\delta$ are summed with the analog input angle and provide an analog output representing $(\theta - \phi1 - \delta)$ which is approximately equal to $(\theta - \phi)$. The output value of $\theta$ minus $\phi$ can be made as accurate as desired by proper selection of components used in the high accuracy digital analog converter 14 and the medium accuracy digital to analog converter 18, and by proper selection of the size of the digital angle delta ($\delta$). The size selected for the digital angle $\delta$ will determine the number of major angle components $\phi1$ which must be provided.

In a common embodiment of the invention, the input to the translator 10 is in cosine and sine form, from a resolver (not shown). The term resolver is herein intended to mean synchro, differential transformer, control transformer, resolver transformer, and any other sinosoidal indicating device. A resolver is basically an angular position transducer which transmits position information in the form of amplitude modulated sine wave signals. When excited by a reference or carrier voltage of the form $E \sin \omega t$, a typical resolver gives a two-phase signal as follows: $Vs = (Ks\ E \sin\theta)(\sin\omega t + \psi s)$ and $Vc = (Kc\ E \cos\theta)\sin(\omega t + \psi c)$. The desired information from the resolver $Vs$ and $Vc$ are sine wave signals of amplitudes $Ks\ E \sin\theta$ and $Kc\ E \cos\theta$, respectively. Omega, $\omega$ is the frequency of the carrier; $\psi s$ and $\psi c$ are the phase shifts of the output signals; $Ks$ and $Kc$ are the transmission factors of the resolver; and $E$ is the carrier amplitude. In a good resolver, $\psi s$ and $\psi c$ are practically 0, and $Ks = Kc = Kr$, a constant for the resolver. Sin $\omega t$ provides no information in itself, but acts only as a carrier for the information. The amplitude of sin $\omega t$, the carrier, represents the desired since and cosine functions. Throughout the rest of this disclosure the carrier portion $E$ sin $\omega t$ will be omitted, but it is to be understood in actual embodiments it will normally be present. It carries no information but acts only to provide a carrier for the desired functions as is well known in the art.

The translator 10 can be described as a hybrid computer which performs the computation of the function sin $(\theta - \phi)$ where $\theta$ is the angular position indicated by a resolver (not shown) and $\phi$ is the digital programmed or desired angle. The analog function sin $(\theta - \phi)$ is generated by performing certain trigonometric manipulations on the resolver output signals, sin $\theta$ and cos $\theta$ and is based on the following identity:

$$\text{Sin }(\theta - \phi) = (\sin \theta - \cos \theta \tan \phi) \cos \phi$$

Figure 2:
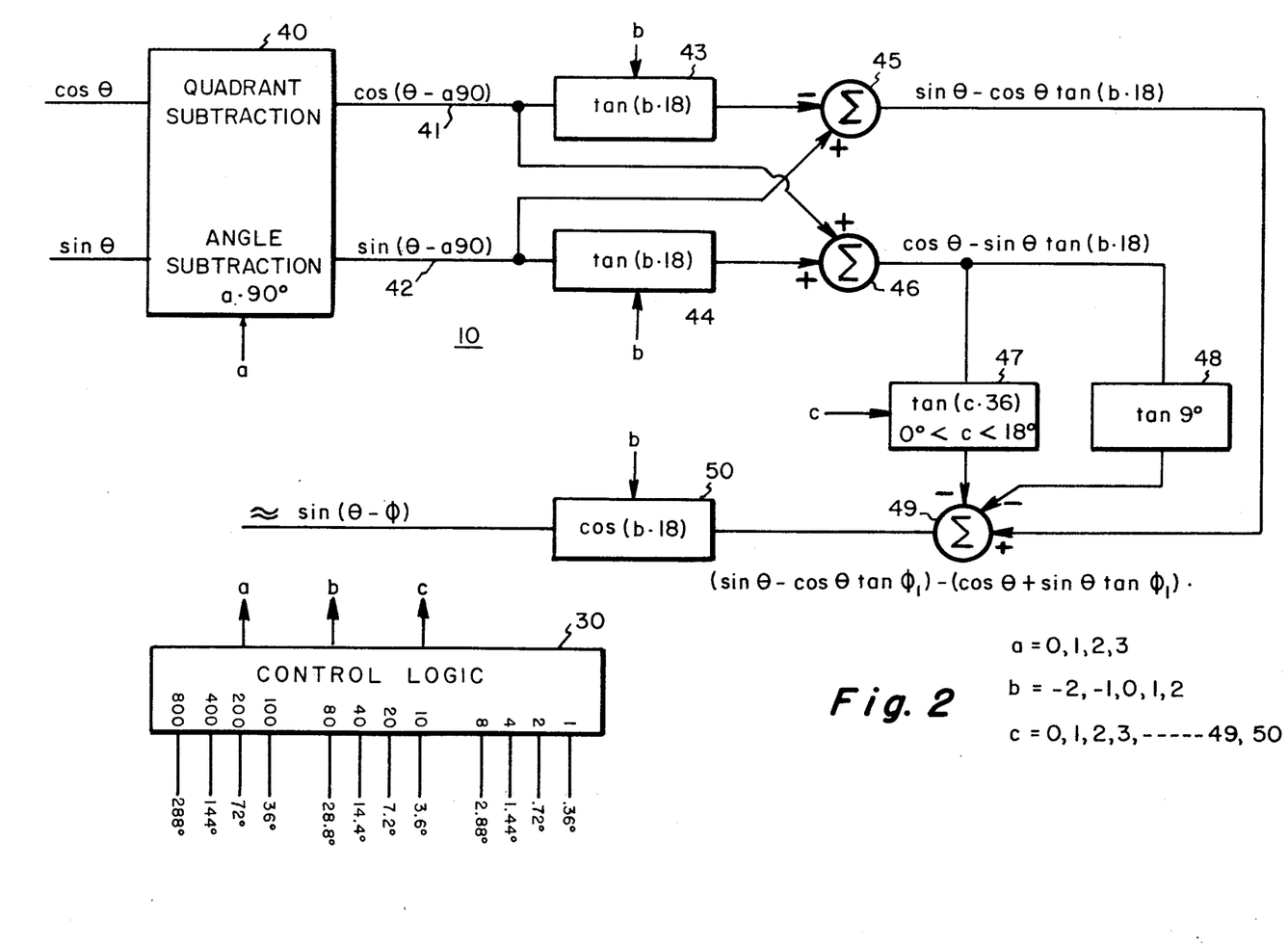
FIG. 2 is a more detailed block diagram of a translator utilizing the teaching of the present invention.
Figure 3:
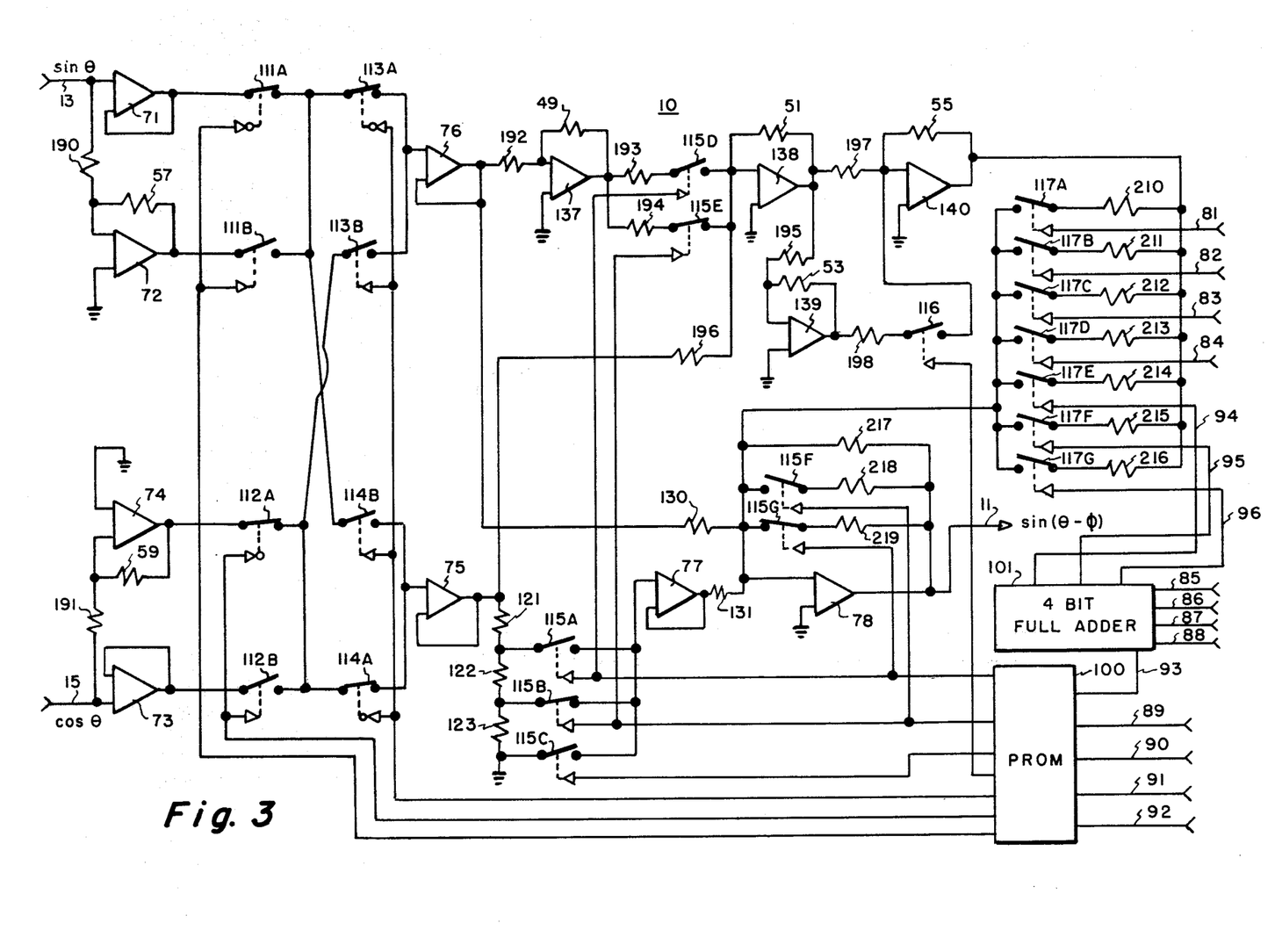
FIG. 3 is a circuit schematic of a translator utilizing the teaching of the present invention.

The digital programed angle $\phi$ is usually available as a twelve-bit binary coded decimal (BCD) word. As stated above, the input to the translator is usually in two forms, one is amplitude modulated sine wave signals from a resolver, which corresponds to an angular position $\theta$ of the resolver shaft, and the other signal is a digital twelve-bit long word corresponding to the desired position $\phi$. In general, the translator electronics is designed to perform the computation of the function sin $(\theta - \phi)$. Some prior art translators use the trigonometric identity sin $(\theta - \phi) = \sin \theta \cos \phi - \cos \theta \sin \phi$ to obtain the desired output. In the disclosed translator, as illustrated in FIGS. 2 and 3, the computation is performed using the trigonometric identity sin $(\theta - \phi) = (\sin \theta - \cos \theta \tan \phi) \cdot (\cos \phi)$; where sin $\theta$ and cos $\theta$ represent the amplitudes of the resolver output and tan $\phi$ and cos $\phi$ are the programed weights corresponding to the desired digital input angle $\phi$. The weights tan $\phi$ and cos $\phi$ are required accurately only for large angles. For small angles, cos $\phi$ is approximately equal to 1 and the correction factor cos $\phi$ can be omitted and only affect the magnitude of the function sin $(\theta - \phi)$ very slightly.

For the translator 10 shown in FIG. 2, the digital word which expresses a desired angular position $\phi$, is twelve-bits long and is in binary coded decimal (BCD) format. This represents three decades and the most significant decade, the hundreds decade, proceeds in increments of 36° each. However, the weights tan $\phi$ and cos $\phi$ are needed only for three unique angles, 0°, 18° and 36°. The weight for other angles, which are multiples of 18°, can always be expressed in terms of the weights for 0°, 18° and 36° with proper signs. The weights corresponding to 0°, 18° and 36° are referred to as ratios. The excess of the digital angle $\phi$ over the nearest angle being a multiple of 18° is called the difference angle. This is equivalent to the small digital angle $\delta$ shown in FIG. 1. For small angles tan $\phi$ approximately equals $\phi$ and cos $\phi$ approximately equals 1. These relationships are used in determining approximate analog value or weight for the small digital angle $\delta$. To understand how the translator 10 works it is helpful to write the formula for sin $(\theta - \phi)$ in a slightly different form as follows:

$$\sin (\theta - \phi) = \sin (\theta - \phi 1 - \delta) \quad (31)$$

$$= [\sin \theta - \cos \theta \tan (\phi 1 + \delta)] \cos (\phi 1 + \delta) \quad (32)$$

$$= \left[ \sin \theta - \cos \theta \; \frac{\sin (\phi 1 + \delta)}{\cos (\phi 1 + \delta)} \right] \cos (\phi 1 + \delta) \quad (33)$$

$$= \sin \theta \cos (\phi 1 + \delta) - \cos \theta \sin (\phi 1 + \delta) \quad (34)$$

$$= \sin \theta (\cos \phi 1 \cos \delta - \sin \phi 1 \sin \delta) - \cos \theta (\sin \phi 1 \cos \delta + \cos \phi 1 \sin \delta) \quad (35)$$

$$= \cos \delta [\sin \theta \cos \phi 1 - \sin \theta \sin \phi 1 \tan \delta - \cos \theta \sin \phi 1 - \cos \theta \cos \phi 1 \tan \delta] \quad (36)$$

$$= [(\sin \theta \cos \phi 1 - \cos \theta \sin \phi 1) - (\sin \theta \sin \phi 1 + \cos \theta \cos \phi 1) \tan \delta] \cos \delta \quad (37)$$

$$= [(\sin \theta - \cos \theta \tan \phi 1) - (\cos \theta + \sin \theta \tan \phi 1) \tan \delta] \cos \phi 1 \cdot \cos \delta \quad (38)$$

and finally for a small angle approximation where tan $\delta$ approximately equals $\delta$ and cos $\delta$ approximately equals 1, we have the following approximation:

$$\sin (\theta - \phi) = [(\sin \theta - \cos \theta \tan \phi 1) - (\cos \theta + \sin \theta \tan \phi 1) \delta] (\cos \phi 1) \quad (39)$$

As is obvious in the above formula $\phi$ equals $\phi 1 + \delta$; and $\delta$ is the excess over or difference of the programed digital angle $\phi$ compared to $\phi 1$.

The quantity, (sin $\theta - \cos \theta \tan \phi 1$) is computed using a precision resistor network for weights of tan $\phi 1$. This is necessary since it greatly affects the signal sin $(\theta - \phi)$. On the other hand, the quantity, $-(\cos \theta + \sin \theta \tan \phi 1)$ need not be computed to the same degree of accuracy since this is only a scaling factor for $\delta$. The same ratio for tan $\phi 1$ is involved in the computation of both terms. Finally, after adding the quantities algebraically the one time correction factor cos $\phi 1$ is applied which again need not be highly accurate. In other words, high precision resistors are required only in the computation of the term (sin $\theta - \cos \theta \tan \phi 1$) and thus the number of precision resistors required is substantially reduced over prior art weighing networks.

For the translator 10 shown in FIG. 2, the four quadrants are divided into angles spaced 18° apart. That is, the computation is carried out of sin $(\theta - \phi 1 - \delta) = [(\sin \theta - \cos \theta \tan \phi 1) - (\cos \theta + \sin \theta \tan \phi 1) \delta](\cos \phi 1)$, where $\phi 1$ is $n \times 18°$ for values of $n$ from 0 to 19. By angle formation this can be broken down to $\phi 1 = n \times 18° = (90a + 18 \cdot b)$ where $a = 0, 1, 2$ or $3$; and $b = -2, -1, 0, +1$ or $+2$.

Thus the sin $(\theta - \phi 1)$ can be represented as [sin $\theta - \cos \theta \tan (90a + 18b)$] cos $(90a + 18b)$.

Referring now to the translator 10 shown in FIG. 2, the values of $a$, $b$ and $c$ are provided by the control logic 30. C is a digital representation of digital counts between 0 and 49, which is equivalent to a span of 18°. The value of $c$ represents the digital difference $\delta$. The quadrant selector 40 can take various multiples of 90° away from the input angle $\theta$ in sine, cosine form, so that the desired trigonometric function can be calculated with a limited number of precision resistors. The outputs of quadrant selector 40 are provided on lines 41 and 42. The quadrant selector 40 provides the proper signs so the outputs are in the proper quadrant. The proper ratio of the precision weighing resistors is then applied to the output of quadrant selector 40 through the tangent multipliers 43 and 44. The cosine output of the quadrant subtractor 40 weighed by the tangent multiplier 43 is subtracted at summing junction 45 from the sine output of the quadrant subtractor 40. Thus the output of summing junction 45 is the first term of equation 39, that is, $(\sin \theta - \cos \theta \tan \phi 1)$. The sine output of quadrant subtractor 40 after being weighed by the proper tangent ratio multiplier 44 is added to the cosine output of quadrant subtractor 40 to provide the second major term of equation 39, that is, $(\cos \theta + \sin \theta \tan \phi 1)$. This second term, the output of summing junction 46 must weight the small angle difference $\delta$, provided by $c$. This weighing is provided through tangent multipliers 47 and 48. Two tangent multipliers are provided so that with $c$ equal to 0 the term will be weighed by the tangent of $-9°$; with $c$ equal to 49, which is equivalent to $17.64°$, the output of the tangent multipliers will be essentially equal to $8.64°$. Each count of $c$, which can vary from 0 to 49, is equivalent to a position change of $0.36°$. This method of operation is provided, rather than varying the approximation of the tan $\delta$ term from $0°$ to $18°$ since it provides greater accuracy. In equation 39, $\delta$ approximates the tangent of $\delta$ and the smaller the tangent of $\delta$ the better the approximation. Thus, by keeping $\delta$ between $-9°$ and $+9°$ an $18°$ range for $\delta$ is obtained while the maximum error introduced for the $\delta$ term is equivalent to an error approximation of $\delta$ over $9°$. The outflow of summing junction 49 provides the solution to the entire equation 39 with the exception of the correction factor cos $\phi 1$ which is added by cosine multiplier 50. That is, the output of summing junction 49 is $(\sin \theta - \cos \theta \tan \phi 1) - \cos \theta + \sin \theta \tan \phi 1) \times \delta$. This equation is then multiplied by the cosine correction term multiplier 50, representing cos $\phi 1$, to provide an output which is approximately equal to the sin $(\theta - \phi)$.

The complex logic involved in operating the analog switches to carry out the described function is accomplished by a programmable read only memory (PROM) chip and a four-bit full adder circuit. The entire trigonometric manipulation is accomplished using operational amplifiers, precision resistors, analog switches, a PROM and a full adder circuit as shown in more detail in FIG. 3.

The output of the translator is a modulated error signal proportional to sin $(\theta - \phi)$ sin $\omega t$, indicated in FIG. 3 without the carrier along line 11. The inputs to the translator 10 are the amplitude modulated resolver signals, sin $\theta$ sin $\omega t$ and cos $\theta$ sin $\omega t$ which are indicated for simplicity as sin $\theta$ and cos $\theta$ in the circuit schematic of FIG. 3 on lines 13 and 15, respectively. Operational amplifiers (op-amps) 71 and 73 are noninverting amplifiers with unity gain. Operational amplifiers 72 and 74 are inverting amplifiers with gains of $-1$. The four amplifiers 71–74 generate the signals $+\sin \theta$, $-\sin \theta$, $+\cos \theta$, and $-\cos \theta$. The digital input angle $\phi$ is represented by a twelve-bit digital word in BCD format and is presented to the input lines marked 81 through 92. The BCD word representing $\phi$ presents binary bits for decimal numbers 0 to 999. The BCD word can be broken down into the hundreds, tens and ones decades. All the hundred decade bits are presented to inputs 89 through 92. Tens decade bits are applied on terminals 85 through 88; and if the equivalent of 50 or more bits are presented to full adder 101 a signal is fed along line 93 to the programmable read only memory (PROM) 100. The four-bit full adder 101 thus essentially acts as a subtractor; subtracting a 50-bit count, corresponding to $18°$, from the inputs on lines 85 through 88. If the input to full adder 101 on lines 85 through 88 is less than 50, the output is fed along lines 94, 95 and 96. If the input to the four-bit full adder 101 is greater than 50, then 50 is subtracted from the input and the difference is fed along lines 94, 95 and 96 along with the signal fed along line 93. The ones decade digital counts are fed in through lines 81 through 84. The PROM 100 utilizing the inputs provided on 89, 90, 91, 92 and 93 selects the proper logic switching for operating analog switches 110 through 116, to obtain the very accurate analog signal for digital angle $\phi 1$ which is within $18°$ or 50 digital counts of the digital input angle $\phi$. The small digital angle $\delta$ is represented by the signals on lines 81, 82, 83, 84, 94, 95 and 96.

The switches 111A, 111B, 112A and 112B select the proper polarity, + or –, of the resolver input signals, depending upon the quadrant in which the programed digital angle $\phi$ lies. The controls for any switch pair 111, 112 – A or B are such that if A switch is closed, B is open. That is, A and B are alternative switch positions. Thus, either $+\sin \theta$ or $-\sin \theta$ is selected and the same is true of $+\cos \theta$ or $-\cos \theta$. The sign selection can be illustrated by the following example: With $\phi 1 = 36°$, the formula for sin $(\theta - 36°) = (\sin \theta - \cos \theta \tan 36°)$ $(\cos 36°)$. Therefore, the signals $+ \sin \theta$ and $- \cos \theta$ would be selected. On the other hand, if $\phi 1$ is in the second quadrant, say $144°$, than sin $(\theta - 144°) = (-\sin \theta - \cos \theta \tan 36°) (\cos 36°)$ and the signals $-\sin \theta$ and $- \cos \theta$ would be selected. Switch pairs 113 and 114 select the octant to which the programed angle $\phi$ belongs. This is illustrated by the following example: with $\phi = 18°$, sin $(\theta - 18°) = (\sin \theta - \cos \theta \tan 18°) (\cos 18°)$. Sign selection would be $+ \sin \theta$ and $- \cos \theta$. To generate the product $- \cos \theta \tan 18°$, the $- \cos \theta$ signal would be switched into operational amplifier 75 through switch 114A, the weight tan of $18°$ would be selected by turning on the appropriate switch, 115B and the product $(- \cos \theta \tan 18°)$ would be generated at the output of amplifier 77. If $\phi$ were $108°$, thus in the third quadrant, the formula for sin $(\theta - 108°) = (- \cos \theta - \sin \theta \tan 18°) (\cos 18°)$, the signs would be selected as indicated above. Since the product $- \sin \theta \tan 18°$ appears in the above formula, $- \sin \theta$ will be switched through switch 114B so that $- \sin \theta \tan 18°$ would be generated at the output of amplifier 77. At the same time, $- \cos \theta$ signal would be switched on to the input of amplifier 76 through switch 113B. Operational amplifiers 75, 76 and 77 are noninverting buffer amplifiers of unity gain.

The summation of the signals from the output of amplifier 76 and amplifier 77 is achieved at the input of amplifier 78 through resistors 130 and 131. This provides the $(\sin \theta - \cos \theta \tan \phi 1)$ term of equation 39.

The circuit consisting of amplifiers 137, 138, 139 and 140 switches 115D, 115E and 116 are utilized for computing the function $(\cos \theta + \sin \theta \tan \phi 1)$ necessary for the solution of equation 39. Switches 117 A through G are used to generate the function tangent of $\delta$; wherein the linear approximation for $\delta$ is utilized for tan $\delta$. $\delta$ represents the excess of the programed angle $\phi$ over the analog accurately determined angle $\phi 1$. Resistors 210 through 216 have relative weights increasing for BCD increases in the small angle input $\delta$. Since $(\cos \theta + \sin \theta \tan \phi 1)$ is used as the scaling factor for the input to the switching network comprising resistors 210 to 216 an output is provided equal to (cos θ + sin θ tan φ1) δ and this is the second major term necessary for the computation as indicated in equation 39. This term is likewise summed into amplifier 78. Note in this construction δ approximates tan δ for angles of 0° to 18°; while on the diagram shown in FIGS. 2 δ approximates tan δ for angles from −9° to +9°. The weighing network consisting of resistors 217, 218 and 219, is utilized to generate the one time correction factor cos φ1. The one time correction factor, cos φ1 is involved in correcting [(sin θ − cos θ tan φ1) − (cos θ + sin θ tan φ1)δ] of equation 39. This factor is applied once and for all through switches 115F and 115G and resistors 217, 218 and 219 resulting in an output signal of amplifier 78 approximately equal to sin (θ − φ).

Figure 4:
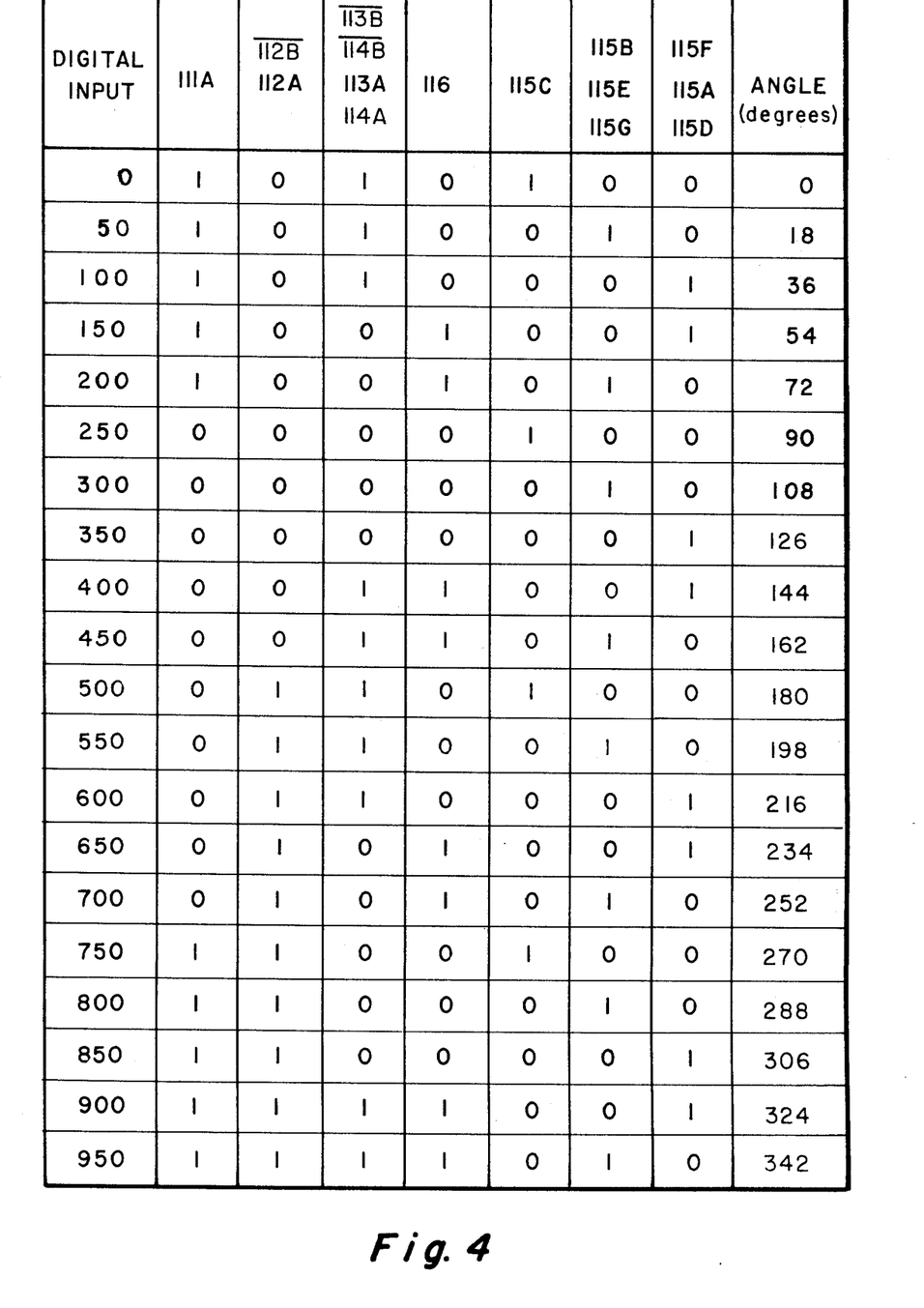
FIG. 4 is a chart indicating the position of switches in the translator circuit shown in FIG. 3 for various major angle digital inputs to the PROM.

The control logic signals necessary for the analog switching of switches 111 through 116 are generated by the outputs of the programmable read only memory 100. The position of switches 111 through 116 for various digital input angles φ1 are shown in FIG. 4.

Thus switches 111 through 114 determine quadrant angles of 0°, 90°, 180° and 270°. This selected output is combined with the angles of 0°, 18° or 36°, either positive or negative, to divide the four quadrants into five increments of 18° each. δ is 18° or less; and the analog approximation of δ is summed with the analog representation of φ1 to give an approximate analog representation of φ. This representation of φ is then combined with the input from the resolver θ to yield (θ − φ).

The following table list the items which have been used to construct a solid state transistor 10 as shown in FIG. 3.

PARTS LIST FOR TRANSLATOR (10)

| ITEM NUMBER | PART TYPE | PART NUMBER |
|---|---|---|
| 71, 72, 73<br>74, 75, 76<br>77, 78, 134<br>138, 140 | Operational<br>Amplifier | 741<br>Fairchild |
| 53, 190, 130<br>57, 55, 191<br>197, 59, 195 | Resistor | 10K, .01% |
| 111A,B<br>113A,B<br>112A,B<br>114A,B<br>115A,B,C,D,E,F,G<br>117A,B,C,D,E,F,G | Analog<br>Switch | 4016<br>RCA |
| 121 | Resistor | 2.7346K .01% |
| 122 | Resistor | 4.0162K .01% |
| 123 | Resistor | 3.3492K .01% |
| 192 | Resistor | 20K .1% |
| 49 | Resistor | 20K .1% |
| 193 | Resistor | 27.2K .1% |
| 194 | Resistor | 61.2K .1% |
| 198 | Resistor | 5.0K .1% |
| 196 | Resistor | 20.0K .1% |
| 217 | Resistor | 14K 1% |
| 218 | Resistor | 62K 1% |
| 219 | Resistor | 270K 1% |
| 210 | Resistor | 40K .1% |
| 211 | Resistor | 80K .1% |
| 212 | Resistor | 160K .1% |
| 213 | Resistor | 200K .5% |
| 214 | Resistor | 400K 1% |
| 215 | Resistor | 800K 1% |
| 216 | Resistor | 1.6M 5% |
| 51 | Resistor | 20K .1% |
| 101 | Full Adder | 7483<br>Fairchild |

-continued

PARTS LIST FOR TRANSLATOR (10)

| ITEM NUMBER | PART TYPE | PART NUMBER |
|---|---|---|
| 100 | PROM | IM5600<br>Intersil |

Thus, it can be seen that the disclosed translator uses only solid state circuitry to provide an analog output equivalent to the difference between a digital input and an analog input. The only high precision resistors required are 121, 122 and 123 and input and feedback resistors 53, 55, 57, 59, 130, 190, 191, 195 and 197 for amplifiers 139, 140, 72 and 74. Thus it can be seen the number of precision weighing resistors is small compared with the number of angles accurately determined.

What is claimed is:

1. Apparatus for providing a signal indicating an algebraic summation of a digital angle input and an analog angle input, in trigonometric form, comprising:
   angle determining means responsive to the digital angle input for determining the required angular change in the digital angle input to express the digital angle input within a predetermined angular range;
   digital expressing means for changing the digital angle input by the required angular change to lie within a predetermined angular range less than 90° and utilizing a plurality of switches and weighing resistors to express the changed digital angle as an analog equivalent angle;
   manipulating means for manipulating the analog angle input by the required angular change to allow the digital angle input to be expressed within the predetermined angular range so that the difference between the manipulated analog angle input and the analog equivalent angle is equal to the desired angular difference; and
   summing means providing the difference between the analog equivalent angle, representative of the digital angle input, and the manipulated analog angle input, representative of the analog angle input.

2. Apparatus as claimed in claim 1 wherein:
   said digital expressing means for expressing the digital angle input as an analog equivalent angle lying within a preselected angular range less than 90° expresses the digital angle input within a range of no more than 45°.

3. Apparatus as claimed in claim 2 wherein:
   said digital expressing means for expressing the digital angle input as an analog equivalent angle utilizes the reduction of $$\phi = (n90° \pm \beta)$$

where
   φ is the digital angle input;
   β is the equivalent angle;
   n is equal to 0, 1, 2 or 3; and
   β ≤ 45°.

4. Apparatus as claimed in claim 2 wherein:
   said summing means provides an output of sin (θ − φ), where θ is the analog input and φ is the digital input; and
   said summing means calculates and combines all terms of the function cos φ (sin θ − cos θ tan φ).

5. Apparatus as claimed in claim 2 wherein:

said summing means provides an output of cos ($\theta - \phi$), where $\theta$ is the analog angle and $\phi$ is the digital angle by forming and combining all terms of the identity cos $\phi$ (cos $\theta$ + sin $\theta$ tan $\phi$).

6. Apparatus as claimed in claim 1 wherein:
said means for controlling the manipulation of the analog angle input comprises a programmable memory.

7. Apparatus as claimed in claim 1 wherein:
said summing means comprises a summing resistor network.

8. Apparatus as claimed in claim 1 wherein:
said manipulating means for manipulating the analog angle input changes the analog angle input by a multiple of 90°.

9. Apparatus as claimed in claim 1 wherein:
said analog input is held equivalent to zero degrees providing a digital to analog converter.

10. Apparatus for providing a signal indicating an algebraic summation of a digital angle input and an analog angle input, in trigonometric form, comprising:
angle determining means responsive to the digital angle input for determining the required angular change in the digital angle input to express the digital angle input within a predetermined angular range;
digital expressing means for changing the digital angle input by the required angular change to express the digital angle input as an equivalent angle lying within a predetermined angular range less than 90°;
manipulating means for manipulating the analog angle input by the required angular change to allow the digital angle input to be expressed within the predetermined angular range so that the difference between the manipulated analog angle input and the equivalent angle is equal to the desired angular difference;
summing means providing the difference between the equivalent angle representation of the digital angle input and the manipulated analog angle input;
said digital expressing means for expressing the digital angle input as an equivalent angle utilizing the reduction of
$\phi = (n90° \pm \beta)$;
where
$\phi$ is the digital angle input;
$\beta$ is the equivalent angle;
$n$ is equal to 0, 1, 2 or 3;
$\beta \leq 45°$; and
said summing means provides the output sin ($\theta - \phi$) by implementing the identity, $$\cos\beta \left[ \begin{bmatrix} 1 \\ 0 \\ -1 \\ 0 \end{bmatrix} (\sin\theta \pm \cos\theta\tan\beta) - \begin{bmatrix} 0 \\ 1 \\ 0 \\ -1 \end{bmatrix} (\cos\theta \pm \sin\theta\tan\beta) \right] ; \begin{bmatrix} 0 \\ 1 \\ 2 \\ 3 \end{bmatrix}_{n=}$$

where $\theta$ is the analog input angle.

11. Apparatus for providing a signal indicating an algebraic summation of a digital angle input and an analog angle input, in trigonometric form, comprising:
angle determining means responsive to the digital angle input for determining the required angular change in the digital angle input to express the digital angle input within a predetermined angular range;
digital expressing means for changing the digital angle input by the required angular change to express the digital angle input as an equivalent angle lying within a predetermined angular range less than 90°;
manipulating means for manipulating the analog angle input by the required angular change to allow the digital angle input to be expressed within the predetermined angular range so that the difference between the manipulated analog angle input and the equivalent angle is equal to the desired angular difference;
summing means providing the difference between the equivalent angle representation of the digital angle input and the manipulated analog angle input;
said digital expressing means for expressing the digital angle input as an equivalent angle utilizing the reduction of
$\phi = (n90° \pm \beta)$;
where
$\phi$ is the digital angle input;
$\beta$ is the equivalent angle;
$n$ is equal to 0, 1, 2 or 3;
$\beta \leq 45°$; and
said summing means provides the output cos ($\theta - \phi$) by implementing the identity, $$\cos\beta \left[ \begin{bmatrix} 1 \\ 0 \\ -1 \\ 0 \end{bmatrix} (\cos\theta \mp \sin\theta\tan\beta) + \begin{bmatrix} 0 \\ 1 \\ 0 \\ -1 \end{bmatrix} (\sin\theta \pm \cos\theta\tan\beta) \right] ; \begin{bmatrix} 0 \\ 1 \\ 2 \\ 3 \end{bmatrix}_{n=}$$

where $\theta$ is the analog input angle.

12. A digital to analog converter for converting a digital angle to an analog angle comprising:
means for expressing the digital angle as an equivalent digital angle lying within a preselected angular range less than 90°;
means for providing a first analog signal equivalent to the difference between the digital angle and the equivalent digital angle;
digital to analog converter means utilizing a plurality of switches and weighing resistors for converting the equivalent digital angle to a second analog signal equivalent; and
summing means for summing the first and scond analog signals.

13. A method for determining the difference between a first angle, in digital form, and a second angle, in analog form, comprising the steps of:
determining an angle which can be subtracted from the first angle so the difference lies within a desired preselected range;
subtracting an angle in digital form, equivalent to the determined angle, from the first angle providing an equivalent first angle;

subtracting an angle in analog form, equivalent to the same determined angle, from the second angle providing an equivalent second angle;

converting the equivalent first angle and the equivalent second angle to a compatible analog form utilizing a plurality of weighing resistors; and subtracting the equivalent second angle from the equivalent first angle.

14. A method for providing the output $\sin(\theta - \phi)$ for an analog angle $\theta$ and a digital angle $\phi$ by utilizing the identity $\cos\phi \, (\sin(\theta - \cos\theta \tan\phi)$ for digital angles $\phi$ from 0° to 360° comprising the steps of:

calculating an angle by which $\phi$ can be changed to lie within a range of 0° to 45°;

reducing $\phi$ by the angle to a value $\phi'$ lying within the range $0° \leq |\phi'| \leq 45°$;

reducing $\theta$ by the angle to a value $\theta'$;

changing $\phi'$ to an analog equivalent angle $\phi''$ by utilizing a plurality of switches and a plurality of weighing resistors;

solving the identity using $\theta'$ for $\theta$ and $\phi''$ for $\phi$ to form and combine the analog terms $\cos\phi'' \, (\sin\theta' - \cos\theta' \tan\phi'')$.

15. An angular translator for determining the difference between a first input angle ($\theta$) which is in trigonometric form and a second input angle ($\phi$) which is in digital form comprising:

angle determining means utilizing a plurality of precision weighing resistors for providing a trigonometric signal equivalent to the exact value of a predetermined number of digital angles;

selecting means connected to said angle determining means for selecting the predetermined angle ($\phi 1$) nearest second input angle ($\phi$), which is in digital form, and providing a first output of the selected angle ($\phi 1$) to said angle determining means and a second output ($\delta$) representing the difference between the selected predetermined angle ($\phi 1$) and the second input angle ($\phi$);

approximately angle means connected to said second output ($\delta$) of said selecting means for providing a trigonometric representation of the approximate value of ($\delta$) the difference between the selected angle ($\phi 1$) and the second input angle ($\phi$); and summing means for collecting the trigonometric representations and providing an output of the difference between the first input angle ($\theta$) and the second input angle ($\phi$).

16. An angular translator as claimed in claim 15 wherein said angle determining means comprises:

weighing resistors for providing reference signals for a plurality of trigonometric functions;

switching means for connecting the first angle input ($\theta$) and said weighing resistors in various configurations; and a programmable read only memory for selecting the proper switching configuration and weighing resistor means connection to get exact trigonometric signal for a predetermined number of digital angle inputs.

17. An angular translator as claimed in claim 15 wherein:

said angle determining means uses a plurality of precision weighting resistors; and said approximating angle means uses a plurality of weighting resistors of lesser precision.

18. An angular translator as claimed in claim 17 wherein:

the number of precision weighting resistors in said angle determining means is less than the number of predetermined angles.

19. An angular translator as claimed in claim 17 wherein:

said angle determining means comprises a number of precision weighting resistors; and the number of precision weighting resistors required is less than one-fourth of the number of predetermined angles.

20. An angular translator as claimed in claim 15 wherein:

said approximating angle means comprises a voltage divider wherein each step is equivalent to a predetermined angle; and comprising, biasing means applying a voltage across the voltage divider; and said biasing means voltage being determined by the first input angle to the angular translator.

21. A translator for providing the difference between an analog angle input ($\theta$) and a digital angle input ($\phi$) comprising:

digital angle divider means for dividing the digital angle input into a digital major angle component and a digital minor angle component;

high accuracy digital to analog converter means connected to said digital angle divider for converting the digital major angle component to an analog major angle component;

medium accuracy digital to analog converter means connected to said digital angle divider means for converting the digital minor angle component to an analog minor angle component;

summing means receiving the analog angle input, the analog major angle component and the analog minor angle component and providing an output equivalent to the analog angle input minus analog major angle component and the analog minor component; and wherein, the translator provides an output approximately equal to $\sin(\theta - \phi)$ by forming and combining the terms of the function $(\sin\theta - \cos\theta \tan\phi) \cdot (\cos\phi)$.

22. A translator as claimed in claim 21 wherein:

the analog angle input = $\theta$;

the major angle digital angle input = $\phi 1$;

the minor angle digital angle input = $\delta$;

said summing means provides an output of $\sin(\theta - \phi 1 - \delta)$; and, $\phi 1$ is within 45° of the analog angle input; and said medium accuracy digital and analog converter provides the minor angle component which is less than 45°.

23. A translator as claimed in claim 21 wherein:

a first set of high precision resistors is used for determining the $\tan\phi$; and a second set of lesser precision resistors is used for determining $\cos\phi$.

24. A translator for determining the difference between an analog input angle and a digital input angle comprising:

exact angle means utilizing a plurality of weighing resistors and a plurality of switches for determining the analog equivalent of a number of predetermined digital angles;

digital subtracting means for breaking the digital input angle into one of the predetermined digital angles and a digital angular difference representing the difference between the selected predetermined digital angle and the digital input angle;

said exact means connected to said digital subtracting means and providing a first analog signal for the selected predetermined digital angle;

digital analog converting means for converting the digital angular difference to a second analog signal; and summing means for summing the analog input angle, the first analog signal, and the second analog signal and providing an output equivalent to the analog angle input minus the first and second analog signal.

25. A translator as claimed in claim 24 wherein:

the analog input is in sine and cosine form;

said exact angle means for determining analog equivalent of a number of predetermined digital angles uses a number of precision ratio resistors, which is less than the number of predetermined angles, and uses switching polarity of the analog input sine and cosine functions to reflect the values obtained from the precision resistors in all quadrants.

26. A translator as claimed in claim 25 comprising:

programmable read only memory means connected to said digital subtracting means for selecting proper switching of sine and cosine input angles to obtain the equivalent of the predetermined angle in the desired quadrant.

27. A translator as claimed in claim 25 wherein:

the input is in trigonometric form.;

the output is in trigonometric form;

trigonometric solving circuit means for providing an output signal equivalent to the sine of (the analog input angle minus the digital input angle).

28. A translator as claimed in claim 27 wherein said trigonometric solving circuit means uses analog values for the tangent of the digital input angle and the cosine of the digital input angle;

the tangent of the digital input angle is determined by high precision resistors; and the cosine of the digital input angle is determined by lesser precision resistors.

29. A translator as claimed in claim 28 wherein:

the trigonometric solving circuit means provides the sine of (the analog input angle minus the digital input angle) by solving (sine of analog angle minus cosine of the analog angle times tangent of the digital angle).(cosine of the digital angle); and tangent of digital angle is determined by one or more high precision weighing resistors.

30. A transistor as claimed in claim 29 wherein:

the number of precision resistors is less than the number of predetermined angles; and comprising, switching means for translating the value of the tangent of the digital angle in several quadrants by proper selection of polarity in trigonometric function; and, a programmable read only memory is used to select proper switching.

31. A ratiometric resolver translator for providing the difference between a first position indicated by suppressed carrier information from a position sensor and a second position, indicated by information in digital form comprising:

control logic means for dividing the digital angle into a predetermined large quadrant angle and a unique small quadrant angle less than 90°;

converter means for converting the predetermined large quadrant angle and the unique small quadrant angle from digital form to suppressed carrier analog form;

combining means connected to said converter and receiving the large quadrant angle in suppressed carrier form, the small quadrant angle in suppressed carrier form and the first position information in suppressed carrier form for providing a suppressed carrier output signal representative of the difference between the first position and the second position;

said large quadrant angle in suppressed carrier form is determined by using high precision resistors; and said small quadrant angle in suppressed carrier form is determined by using resistors of a lesser precision.

32. A ratiometric resolver translator as claimed in claim 31 wherein:

said control logic means comprises a programmable read only memory.

33. A ratiometric resolver translator as claimed in claim 31 wherein:

the translator provides the output sin $(\theta - \phi)$ by forming and combining the signals cos $\phi$ (sin $\theta$ — cos $\theta$ tan $\phi$); wherein $\theta$ is the first position indication, and $\phi$ is the second position indication.

* * * * *

UNITED STATES PATENT AND TRADEMARK OFFICE
CERTIFICATE OF CORRECTION

PATENT NO. : 3,984,672
DATED : October 5, 1976
INVENTOR(S) : Donald H. Jones

It is certified that error appears in the above–identified patent and that said Letters Patent are hereby corrected as shown below:

Column 3, line 59, "tan $\theta$" should read --tan $\phi$--; line 61, "trionometric" should read --trigonometric--.

Column 5, line 3, "whidh ia" should read --which is--; line 21, "educes" should read --reduces--; line 43, "ditigal" should read --digital--.

Column 6, line 43, "cos ($\theta\phi$)" should read --cos ($\theta - \phi$)--.

Column 11, line 8, "since" should read --sine--.

Column 12, line 53, "(90a + 18 $\cdot$ b)" should read --(90 $\cdot$ a + 18 $\cdot$ b)--.

Column 21, line 3, --angle-- should be inserted after "exact".

Signed and Sealed this

Fifteenth Day of February 1977

[SEAL]

Attest:

RUTH C. MASON
*Attesting Officer*

C. MARSHALL DANN
*Commissioner of Patents and Trademarks*